United States Patent [19]

Finnemore et al.

[11] Patent Number: 5,330,969
[45] Date of Patent: Jul. 19, 1994

[54] METHOD FOR PRODUCING STRAIN TOLERANT MULTIFILAMENTARY OXIDE SUPERCONDUCTING WIRE

[75] Inventors: Douglas K. Finnemore, Ames, Iowa; Theodore A. Miller, Tucson, Ariz.; Jerome E. Ostenson, Ames, Iowa; Louis A. Schwartzkopf, Mankato, Minn.; Steven C. Sanders, Ames, Iowa

[73] Assignee: Iowa State University Research Foundation, Inc., Ames, Iowa

[21] Appl. No.: 980,759

[22] Filed: Nov. 24, 1992

Related U.S. Application Data

[62] Division of Ser. No. 651,551, Feb. 6, 1991, Pat. No. 5,189,260.

[51] Int. Cl.⁵ .......................... B05D 5/12; H01B 12/00
[52] U.S. Cl. .................................. 505/431; 505/704; 505/887; 427/62; 427/125; 427/250; 29/599; 174/125.1
[58] Field of Search ............... 505/1, 704, 887; 427/62, 63, 125, 250; 29/599; 174/125.1

[56] References Cited

U.S. PATENT DOCUMENTS

| | | |
|---|---|---|
| 3,317,286 | 5/1967 | DeSorbo . |
| 3,372,470 | 3/1968 | Bindari . |
| 3,437,459 | 4/1969 | Williams . |
| 3,596,349 | 8/1971 | Boom et al. . |
| 3,616,530 | 11/1971 | Chester . |
| 3,829,964 | 8/1974 | Critchlow et al. . |
| 3,907,550 | 9/1975 | Critchlow . |
| 4,043,028 | 8/1977 | Koike et al. . |
| 4,148,129 | 4/1979 | Young . |
| 4,242,536 | 12/1980 | Young . |
| 4,532,703 | 8/1985 | Verhoeven et al. . |
| 4,917,965 | 4/1990 | Inoue et al. . |
| 4,965,245 | 10/1990 | Sugimoto et al. ............. 505/1 |
| 5,068,219 | 11/1991 | Hagino et al. ............. 505/1 |
| 5,232,901 | 8/1993 | Onishi et al. ............. 505/1 |

OTHER PUBLICATIONS

Sekine et al, "Metallurgical Studies and Optimization of Critical Current Density in Bi-(Pb)-Sr-Ca-Cu-O Superconductors", Jpn. J. Appl. Phys. 28(7) Jul. 1989, pp. 1185–1188.

T. A. Miller et al., "Crystallization of amorphous Bi cuprate fibers to superconducting $Bi_2Sr_2Ca_1Cu_2O_8$," Appl. Phys. Lett. 56(6), p. 584 (Feb. 1990).

T. A. Miller et al., "Microfilamentary $Bi_2Sr_2Ca_1Cu_2O_8$ Fibers," Proceedings of the International Conference on Superconductivity, Bangalore, India (Jan. 1990), p. 1.

S. E. LeBeau et al., "Preparation of superconducting Bi-Sr-Ca-Cu-O Fibers," Appl. Phys. Lett. 55(3), p. 292 (Jul. 1989).

T. Y. Hsiang et al., "Superconducting critical currents for thick, clean superconductor-normal-metal-superconducting junctions," Physical Review B, 22(1), p. 154 (Jul. 1980).

A. Davidson et al., "Remnant Resistance in Tsuei's Composite Superconductors," IEEE Trans. Magn., MAG-11, p. 276 (1975).

J. Righi et al., "Gas Jet Fiberization of $Bi_2Sr_2Ca_1Cu_2O_8$," TMS Conference Proceedings (Feb. 1990), p. 1.

Primary Examiner—Roy V. King
Attorney, Agent, or Firm—Leydig, Voit & Mayer

[57] ABSTRACT

A strain tolerant multifilamentary wire capable of carrying superconducting currents is provided comprising a plurality of discontinuous filaments formed from a high temperature superconducting material. The discontinuous filaments have a length at least several orders of magnitude greater than the filament diameter and are sufficiently strong while in an amorphous state to withstand compaction. A normal metal is interposed between and binds the discontinuous filaments to form a normal metal matrix capable of withstanding heat treatment for converting the filaments to a superconducting state. The geometry of the filaments within the normal metal matrix provides substantial filament-to-filament overlap, and the normal metal is sufficiently thin to allow supercurrent transfer between the overlapped discontinuous filaments but is also sufficiently thick to provide strain relief to the filaments.

10 Claims, 2 Drawing Sheets

METHOD FOR PRODUCING STRAIN TOLERANT MULTIFILAMENTARY OXIDE SUPERCONDUCTING WIRE

This invention was made with Government support under Contract No. W-7405-ENG-82 awarded by the U.S. Department of Energy. The Government has certain right in the invention.

This is a divisional of copending application Ser. No. 07/651,551, filed on Feb. 6, 1991, now U.S. Pat. No. 5,189,260.

FIELD OF THE INVENTION

The present invention relates to superconductors, and more particularly to strain tolerant superconducting wires and a method of preparing these superconducting wires.

BACKGROUND OF THE INVENTION

The phenomenon of superconductivity which many metals exhibit at low temperatures is of great scientific and commercial value since it permits various high powered devices to operate with minimal losses of electrical power. Superconducting devices can be used in such commercial applications as motors, generators, transformers, power lines, medical imaging systems, and large scale supermagnets. Several metal alloys have been discovered which exhibit superconducting properties and have been used to produce multifilament superconducting composites. These superconducting materials include $Nb_3Sn$, $V_3Ga$, Nb-Ti, and $Nb_3Al$. These superconducting materials are typically combined with a normal conductive metal and then formed into long, thin filaments to produce a multifilament superconducting/normal metal composite.

One method for preparing a multifilament superconducting wire, the so-called "bronze process") having a superconducting material such as $Nb_3Sn$, consists of drilling a plurality of evenly spaced holes in a copper or bronze billet, inserting niobium rods in each hole, and extruding and drawing the billet in several steps until the niobium rods are reduced to the desired filament size. The wire is then coated with tin and heated to react the tin and niobium in order to form the $Nb_3Sn$ superconducting material. However, this process is expensive and exacting and generally limits the filament size to filaments larger than 2 $\mu m$ in diameter.

Another method for preparing a multifilamentary superconducting wire, the so-called in-situ process, involves casting large billets of Cu and Nb together in a consumable arc casting process. This produces a casting in which a dense array of Nb dendrites about 6 $\mu m$ in diameter are dispersed in a Cu matrix. This billet is drawn to wire, coated with Sn, and heat treated to transform the Nb to $Nb_3Sn$. These types of composite superconducting wires are known as in-situ composites because the superconducting filaments are formed in place during the process of preparing the multifilament superconducting composite.

Thus, neither of the prior art methods of forming superconducting wires described above separately prepare the filaments of the superconducting material prior to combining them with a normal metal material. Rather, as described above, the filaments are prepared during the casting process.

As stated above, multifilamentary superconducting composites have played a central role in the development of conductors for commercial applications such as large scale magnets because they are more stable magnetically than monolithic tapes and they are far easier to handle in the process of winding the magnet. The fabrication of these composites for high critical temperature materials such as those set forth above, however, has been problematic because the materials are so brittle and the chemistry so complicated.

Advances recently have been made in the development of high temperature superconducting materials based on copper-bearing oxides such as $Y_1Ba_2Cu_3O_7$ and various compositions of Bi-Sr-Ca-Cu-O. These materials have been processed using a wide variety of techniques in an attempt to produce useful engineering devices. Some of the processing techniques used include plasma spraying, sputtering, and laser-heated pedestal growth. However, because of the complexity of these processing techniques, none have been found feasible for use on a mass production basis.

Other methods for processing these materials in filament form have been developed which are more feasible for use on a mass production basis. These methods include a pendant drop melt extraction process and a gas jet fiberization process. The gas jet fiberization process for making amorphous Bi-Sr-Ca-Cu-O fibers has thus far proved to be the most successful. With the gas jet fiberization process, liquid drops of Bi-Sr-Ca-Cu-O are directed through a supersonic nozzle where a gas stream shapes and freezes the liquid into filaments approximately 1 cm long having diameters that range from 0.5 to 3 $\mu m$. The resulting filaments are in an amorphous state, and must be converted to a superconducting state in a subsequent process in order to produce multifilament superconducting wires. As can be seen, the gas jet fiberization process is an ex-situ process, since the filaments are formed separately and must separately be combined with a normal metal material subsequent to their formation.

Although superconducting filaments formed from Bi-Sr-Ca-Cu-O show promise for use in multifilament superconducting wires, several problems exist which must be overcome. For example, superconducting filaments composed of Bi-Sr-Ca-Cu-O cannot feasibly be produced with the types of in-situ production methods discussed above. A significant reason for this is the complex chemical composition of these filaments. Therefore, new methods must be developed for using these separately formed filaments to produce superconducting wires. Further, with the gas jet fiberization and pendant drop melt extraction methods, the resulting filaments are in an amorphous state and must be converted to the superconducting state by heat treatment. Control of the conversion of these amorphous filaments to the superconducting state is important, because the filaments can coarsen during heat treatment which destroys the long slender aspect ratio of the filaments. Finally, because of the geometry of the filaments, that is, their comparatively short length, on the order of 1 cm, and their resulting discontinuous nature, it is difficult to realize large supercurrents in a superconducting wire having only a relatively small number of these filaments. Thus, a method of using a large number of these discontinuous filaments must be developed which provides substantial filament-to-filament transfer of supercurrents among the discontinuous filaments.

In spite of these difficulties, the use of Bi-Sr-Ca-Cu-O filaments has many potential advantages. For example, with the gas jet fiberization process, the resulting ex-situ filaments are amorphous, electrically insulating and relatively strong. The flexibility of these filaments, because they are in an amorphous state, allows them to better withstand mechanical processing to form microfilamentary superconducting wires. Further, the use of Bi-Sr-Ca-Cu-O filaments has great advantages over the use of filaments formed from other superconducting materials such as those set forth above. For example, the superconducting materials discussed above exhibit poor mechanical properties, namely brittleness, and are not as reliable for use in commercial applications. As a result, these other superconducting materials are not as suitable for production on an industrial scale. Therefore, if the problems discussed above can be overcome, it may be possible to use the flexible Bi-Sr-Ca-Cu-O filaments for producing superconducting wires on a mass production basis.

SUMMARY OF THE INVENTION

In view of the foregoing, it is a general aim of the present invention to provide a highly strain tolerant microfilamentary wire material capable of carrying superconducting currents and a process for making it. In accomplishing that aim, it is an object of the present invention to provide a microfilamentary superconducting wire formed from a composite of a high temperature superconducting material and a normal conductive metal having a special geometry that permits high strain tolerance.

An additional object of the present invention is to provide a method of producing a superconducting wire having such properties.

It is another object of the present invention to develop an ex-situ method of producing semiconductor/normal metal composites using flexible Bi-Sr-Ca-Cu-O filaments.

Because Bi-Sr-Ca-Cu-O filaments are amorphous as formed, it is an additional object of the present invention to develop a method of transforming the filaments from the amorphous state to a superconducting state. Also, because of the geometry of Bi-Sr-Ca-Cu-O filaments, in that they have a large length to diameter ratio but are discontinuous in nature, it is yet another object of the present invention to develop a method of combining a large number of these filaments into a normal metal material so that large supercurrents can be realized.

It is a feature of the superconducting wire of the present invention that the superconducting wire is made up of a plurality of discontinuous superconducting filaments of a high temperature superconducting material, the filaments having a length at least several orders of magnitude greater than the filament diameter and being sufficiently strong while in an amorphous state to withstand compaction. It is a related feature that a very thin layer of normal metal is interposed between and binds the discontinuous plurality of filaments to form a normal metal matrix which is capable of withstanding heat treatment for converting the amorphous filaments to a superconducting state.

It is another feature of the present invention that the geometry of the plurality of filaments within the normal metal matrix provides substantial filament-to-filament overlap to produce superconducting current transfer among the plurality of filaments.

It is yet another feature of the superconducting wire of the present invention that the normal metal interposed between and binding the plurality of discontinuous filaments is sufficiently thin to allow superconducting current transfer between the overlapped filaments while also being sufficiently thick to provide strain relief to the filaments. An additional feature of the present invention is that when the amorphous filaments are converted to the superconducting state, the normal metal matrix retains enough structural integrity to preserve the geometry of the plurality of filaments in the superconducting wire.

In accordance with the strain tolerant microfilamentary superconducting wire of the present invention, a plurality of amorphous discontinuous filaments are provided, the exterior surfaces of the filaments being coated with a thin layer of a normal conductive metal. The amorphous filaments are formed from a high temperature superconducting material, and have a geometry in which the filament length is at least several orders of magnitude greater than the filament diameter. The coated amorphous filaments are then oriented such that the lengths of the filaments lie generally along a desired axis of the superconducting wire, with the filament orientation producing substantial filament-to-filament overlap. Then, the oriented coated filaments are compacted to form an elongate composite in which the overlapped coated filaments are pressed into contact with each other. The composite is then heat treated to crystallize the amorphous filaments while leaving a normal metal interface between the crystallized filaments. This heat treatment preserves the normal metal coating on the filaments to form the normal metal interface in order to produce a superconducting wire in which the crystallized superconducting filaments are supported in a normal metal matrix. The normal metal matrix provides strain relief between the crystallized filaments of the superconducting wire.

According to the present invention, a strain tolerant microfilamentary superconducting wire is provided comprising a plurality of discontinuous filaments formed from a high temperature superconducting material. The filaments have a length at least several orders of magnitude greater than the filament diameter and are sufficiently strong while in an amorphous state to withstand compaction. The superconducting wire further comprises a normal metal interposed between and binding the discontinuous filaments to form a normal metal matrix which is capable of withstanding heat treatment when the filaments are converted to a superconducting state. The geometry of the filaments within the normal metal matrix provides substantial filament-to-filament overlap. Additionally, the normal metal of the normal metal matrix is sufficiently thin to allow supercurrent transfer between the overlapped discontinuous filaments while also being sufficiently thick to provide strain relief to the filaments.

DETAILED DESCRIPTION OF THE PREFERRED EMBODIMENT

While the invention will be described in connection with a preferred embodiment, there is no intent to limit the invention to this embodiment. On the contrary, the intent is to cover all alternatives, modifications, and equivalents included within the spirit and scope of the invention as defined by the appended claims.

Figures 1, 2:
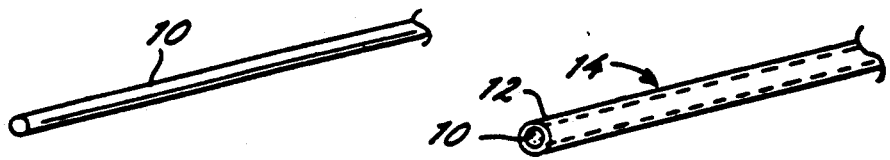
FIG. 1 is a perspective view showing a single filament of the superconducting material used in the superconducting wire of the present invention.
FIG. 2 is a perspective view showing the single filament of FIG. 1 coated with a normal metal material.

Turning now to the drawings, FIG. 1 is a perspective view of a single amorphous filament 10 formed from a high temperature superconducting material used to form the highly strain tolerant superconducting wire material of the present invention. In the preferred embodiment of the present invention, superconducting filaments similar to that shown in FIG. 1 are formed from the high temperature superconducting material Bi-Sr-Ca-Cu-O with the gas jet fiberization method briefly described above and described in detail in S. E. LeBeau, J. Righi, J. E. Ostenson, S. C. Sanders, and D. K. Finnemore, "Preparation of Superconducting Bi-Sr-Ca-Cu-O Fibers" Appl Phys Lett 55, 292 (1989). It should be noted that various compositions of this superconducting material can be used depending on the particular performance characteristics desired. For example, a filament formed from the $Bi_2-Sr_2-Ca_2-Cu_3-O_{10-\delta}$ compound has a higher transition temperature and better performance at high temperatures in the range of 78K. However, the $Bi_2-Sr_2-Ca_1-Cu_2-O_{8-\delta}$ has a lower transition temperature but performs better at 4.2K. Additionally, it may be desirable to replace some of the Bi with Pb in order to significantly lower the temperature needed to crystallize the filaments. Thus, the strain tolerant superconducting wire of the present invention can be formed from any of these various compositions of superconducting material with the process described in detail below.

In the preferred embodiment, in order to fabricate the microfilamentary strain tolerant superconducting wire of the present invention, an ex-situ method of formation is used. First, a plurality of amorphous filaments of (Bi-Pb)-Sr-Ca-Cu-O of the kind shown in FIG. 1 are cleaned to remove any beads, shot, chaff and surface contamination in an ultrasonic bath containing isopropanol. The filaments are then dried in air and placed on a stainless steel pan in an evaporator. These amorphous filaments should have a large length to diameter ratio, preferably at least several orders of magnitude, and most preferably on the order of 10,000:1. Although the filaments have a large length to diameter ratio, the filaments are discontinuous in nature. That is, the filaments have a relatively short length, on the order of 1 cm, with a diameter of about 1 $\mu m$. Therefore, it is necessary to provide an extremely large number of these discontinuous filaments in a single superconducting wire. For example, in the preferred embodiment, a cross section of a 1 mm diameter superconducting wire would contain approximately one million discontinuous filaments.

After the filaments are cleaned, they are coated with a normal metal material by thermal evaporation, chemical vapor deposition or other similar processes. In the preferred embodiment, the filaments are coated with Ag which is evaporated from a tungsten coil, with the first coating having a thickness of about 0.1 $\mu m$. The filaments are then intermixed and another similar evaporation of Ag is made. This process is repeated several times until there is approximately 0.5 $\mu m$ of Ag on the filaments. FIG. 2 shows a coated filament 14 comprising amorphous filament 10 coated with Ag coating 12.

Figure 3:
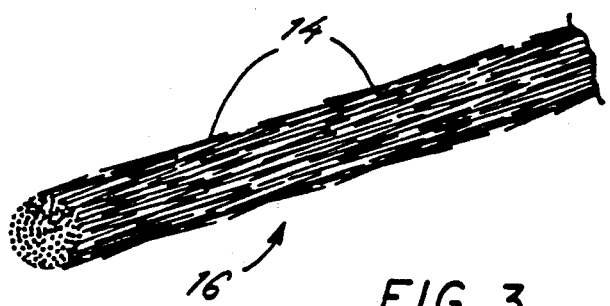
FIG. 3 is a perspective view showing a plurality of the coated filaments of FIG. 2 formed into a yarn.

In order to produce substantial filament-to-filament overlap so that supercurrents can transfer between the plurality of filaments when they are converted to the superconducting state, the plurality of coated filaments 14 are oriented so that the lengths of the filaments lie generally along a desired axis of the superconducting wire. The step of orienting produces a configuration in which a large number of filaments are formed into a bundle or yarn, with the plurality of filaments closely interleaving and overlapping each other Thus, the term "yarn" when used in the description of the present invention, means a plurality of filaments which are oriented and overlapped as described herein to achieve the filament-to-filament overlap needed for supercurrent transfer. In order to orient the filaments, coated filaments 14 are placed in a steam of freon and floated or propelled against a barrier to align the long axis of all the plurality of coated filaments 14 in approximately the same direction. As shown in FIG. 3, the orienting step produces a yarn 16 of coated filaments 14 of the type shown in FIG. 2. Yarn 16 is then dried in flowing air.

Figure 4:
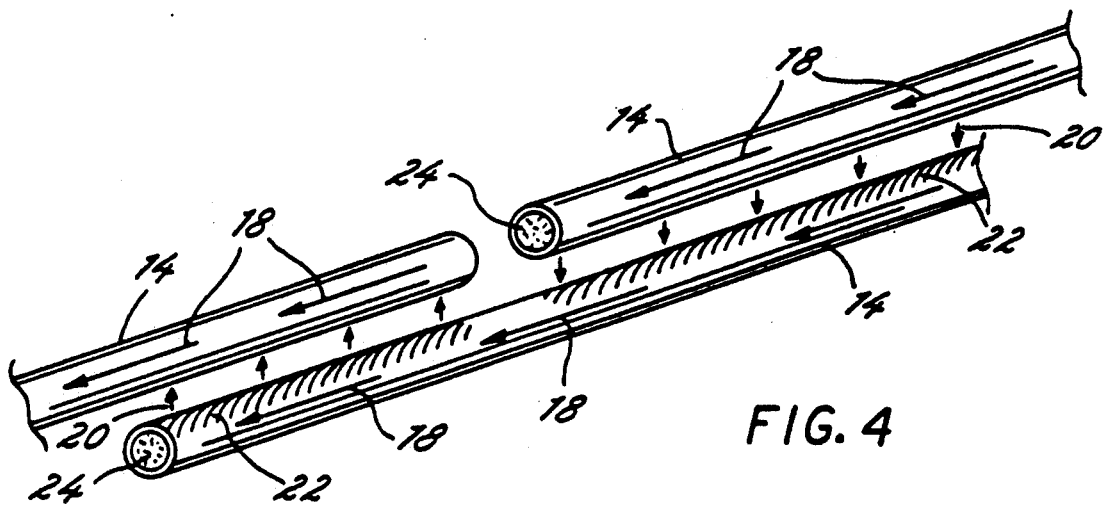
FIG. 4 is a perspective view showing three coated filaments which form a portion of the yarn shown in FIG. 3.

FIG. 4 is shown to demonstrate the substantial filament-to-filament overlap that exists between the plurality of filaments which form yarn 16. FIG. 4 is a magnified view showing three coated filaments 14 which form a portion of yarn 16 shown in FIG. 3. As stated above, currents must transfer between the plurality of overlapped filaments due to their discontinuous nature. In order to demonstrate this filament-to-filament current transfer, FIG. 4 shows currents 18 which flow along the axes of the filaments, and coupling currents 20 which transfer between the discontinuous filaments. FIG. 4 also shows an overlap area or crossover area 22 which represents the overlap area for transfer of coupling currents 20 between the filaments, and a current transport area 24 which represents the area that defines the flow of currents 18 within the filaments.

The term "substantial" when used to describe the amount of filament-to-filament overlap, means that the overlapped and closely interleaved dispersal of the filaments produced in the orienting step, along with the large length to diameter ratio of the filaments, provides an overlap between the plurality of filaments which encompasses nearly the entire area of each of the filaments. In the preferred embodiment of the present invention, the crossover area 22 for filament-to-filament current transfer is at least several orders of magnitude, and most preferably about 10,000 times larger than current transport area 24. Thus, in keeping with the invention, this enormous overlap area allows for supercurrent transfer between the plurality of discontinuous filaments so that superconducting currents can be realized in the strain tolerant microfilamentary superconducting wire of the present invention.

After the orienting step, yarn 16 of coated filaments 14 is compacted to form an elongate composite in order to closely press coated filaments 14 into contact with each other. In one example according to the present invention, a silver foil is rolled around yarn 16 similar to the way in which a cigarette is rolled. In alternative examples, yarn 16 of coated filaments 14 may be mixed with a silver-based powder in varying degrees depending on the specific requirements of the superconducting wire. After yarn 16 is rolled in a silver foil, it is placed in a silver tube. The ends of the tube are sealed in a vacuum, and then the silver tube containing the filaments is compacted by cold isostatic pressing or swaging to form an elongate composite.

Figure 5:
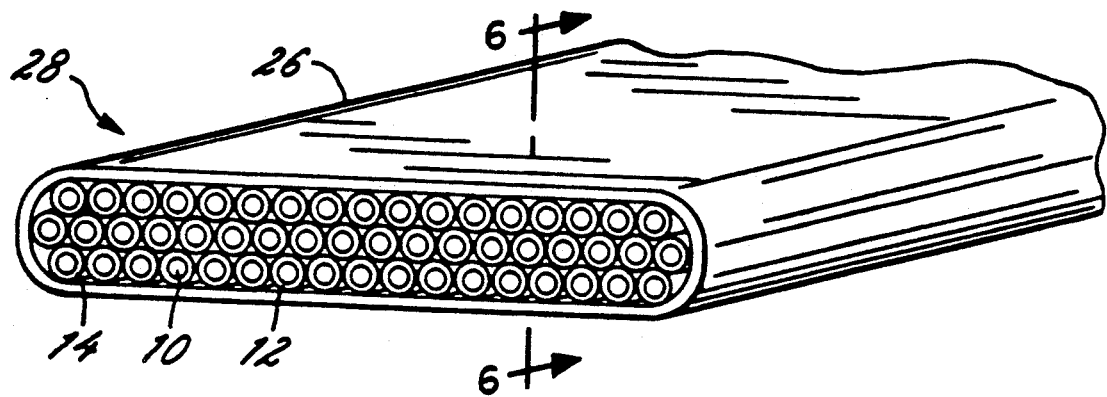
FIG. 5 is a perspective view showing the plurality of coated superconducting filaments as shown in FIG. 3 inserted in a normal metal tube and pressed into a dense microfilamentary composite.

FIG. 5 shows a plurality of coated filaments 14 placed within a silver tube 26 which has been compacted to form an elongate composite 28. As can be seen in FIG. 5, the plurality of coated filaments 14 are pressed into close contact with each other so that supercurrents can transfer between the overlapped filaments. It should be noted that FIG. 5 is not only an enlarged view, but is also simplified to show only a relatively small number of filaments, recalling that in a practical embodiment of the present invention there can be approximately one million filaments in a cross section of a 1 mm diameter wire.

The plurality of coated filaments 14 within elongate composite 28 are in an amorphous state, and must be converted to the superconducting state by a heat treatment process. As stated above, control of this conversion process is very important, because the filaments can coarsen during heat treatment which destroys the long slender aspect ratio of the filaments. Additionally, the temperatures used to convert the amorphous filaments to the superconducting phase must be low enough to preserve the normal metal coating which forms a normal metal matrix surrounding the plurality of filaments. For example, if the temperatures used in the heat treatment process are too high, the normal metal matrix interposed between and binding the filaments can melt and flow, which destroys the continuity of the matrix. However, if successful, this heat treatment process produces a superconducting wire having a geometry in which the plurality of superconducting filaments are supported in a normal metal matrix so that the normal metal matrix provides strain relief between the relatively brittle superconducting filaments.

In the preferred practice of the invention, in order to convert the amorphous filaments to the superconducting state, the temperature of elongate composite 28 is ramped rapidly to a temperature just above the melting point of the superconducting material and held for a specified time. This time may vary from several minutes to several hours depending on the composition of the superconducting material. However, it is of great importance that the temperature remain low enough to preserve the normal metal matrix of silver, so that the normal metal matrix retains sufficient structural integrity to preserve the geometry of the plurality of filaments in the superconducting wire. The exact time-temperature profile and oxygen atmosphere for the heat treatment depends on the composition of the superconducting filaments and can be determined for any given composition by optimization procedures known to those skilled in the art. It should be noted that the conversion of the amorphous filaments to the superconducting phase can be done by either raising the temperature and crystallizing the filaments without melting them, or by melting the filaments and refreezing the liquid to the desired superconducting phase.

Figure 6:
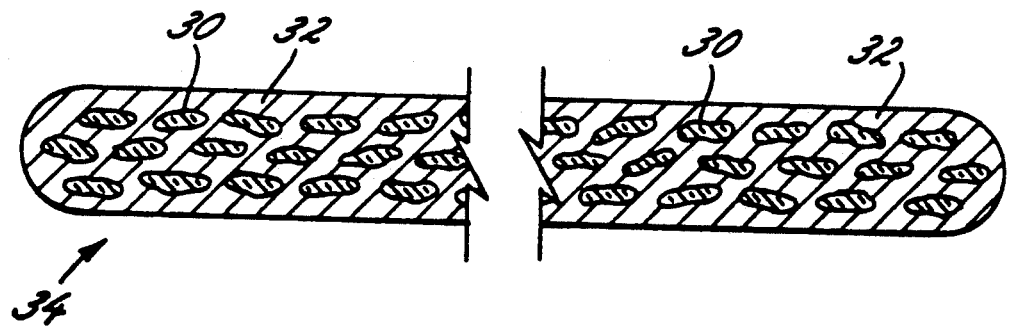
FIG. 6 is a partial magnified front view of the composite of FIG. 5 showing the plurality of filaments in the superconducting state after heat treatment.

FIG. 6 is a partial magnified front view of a superconducting wire 34 of the present invention. Superconducting wire 34 is formed from elongate composite 28 shown in FIG. 4 subjected to heat treatment, and has a plurality of superconducting filaments 30 dispersed in a normal metal matrix 32 composed of silver. As can be seen in FIG. 6, after crystallization, at least with some materials, the superconducting filaments 30 exhibit a micro-ribbon-like shape due to the growth morphology of the superconducting material.

Referring to FIG. 6, a superconducting wire according to the present invention is comprised of a plurality of discontinuous filaments formed from a high temperature superconducting material. As stated above, in the preferred embodiment, the superconducting material is a composition of the high temperature superconducting material (Bi-Pb)-Sr-Ca-Cu-O. These filaments must be sufficiently strong while in an amorphous state to withstand mechanical compaction used to form the superconducting wire. Further, the filaments must have a length at least several orders of magnitude greater than the filament diameter, preferably on the order of 10,000:1.

Because of the extremely small dimensions of the superconducting wire of the present invention, FIG. 6 is a partial magnified schematic view of the superconducting wire and is shown to identify the normal metal interposed between the plurality of superconducting filaments. In actual practice, because the normal metal coating is very thin, superconducting filaments 30 are much closer together. As shown in FIG. 6, superconducting wire 34 comprises a normal metal which is interposed between and binds the plurality of superconducting filaments 30 to form a normal metal matrix 32. Normal metal matrix 32 must be capable of withstanding heat treatment for converting the originally amorphous filaments to the superconducting state. In the preferred embodiment, normal metal matrix 32 is comprised of silver. However, in alternative embodiments, copper, aluminum, lead, or gold can be used as normal conductive metal to form matrix 32.

Because the superconducting filaments are discontinuous, current must flow through the normal metal to travel between filaments. Therefore, in order to provide supercurrent transfer between the filaments, the geometry of the filaments within the normal metal matrix must provide a substantial overlap area between the filaments as described above and shown in FIG. 4. Further, the normal metal interposed between the filaments must be of a minimal thickness in order to allow supercurrent transfer between the overlapped filaments. The thickness of normal metal interposed between the filaments is highly significant, because the superconducting Cooper pairs, upon entering the normal metal material, will decay and revert into the normal state depending on the thickness of the normal metal material. For example, a decay length is a measure of the length of penetration into the normal metal at which Cooper pairs will revert into the normal state. At the first decay length, one-half of the superconducting electrons will revert to the normal state. Similarly, at the second decay length, another one-half of the remaining superconducting electrons will revert to the normal state. In silver, a decay length is approximately 100–200 Å. Thus, if the normal metal interposed between the filaments is overly thick, nearly all of the superconducting Cooper pairs of electrons will revert to the normal state, and very little supercurrents will flow. However, because an extremely large number of electrons are present in the superconducting wire, and because of the large overlap area, the normal metal thickness can be several decay lengths thick.

In keeping with the present invention, the normal metal interposed between the plurality of filaments is sufficiently thin to allow supercurrent transfer between the filaments, but is also sufficiently thick to provide strain relief to the filaments. In the preferred embodiment, the thickness of the silver coating on the filaments is approximately 0.05 to 0.5 $\mu$m. Thinner layers of silver or other normal metal matrix material can be used, when desired, although decreasing the thickness of the matrix would most likely sacrifice some of the strain tolerance of the superconducting wire. Additionally, the geometry of the filaments within the normal metal matrix provides an enormous filament-to-filament overlap area as shown in FIG. 4 and described above, so that supercurrents can be realized.

The microfilamentary superconducting wire of the present invention also permits large normal current flow when supercurrents are not realized. Because of the enormous overlap area between the filaments and the sufficiently thin normal metal matrix, a low effective electrical resistivity in the superconducting wire is provided, on the order of $10^{-14}$ $\Omega$-cm. Thus, even if supercurrents do not flow, the low effective electrical resistivity in the superconducting wire of the present invention will permit large normal current flow.

Finally, in accordance with the present invention, the normal metal matrix is capable of withstanding the heat treatment needed to convert the filaments to the superconducting phase. Therefore, the normal metal matrix retains sufficient structural integrity to provide significant strain relief to the filaments, and to preserve the geometry of the plurality of filaments in the superconducting wire so that supercurrents will flow.

In one example according to the invention, after the step of coating, a measure of the distribution of filament plus Ag diameters showed most of the coated filaments 14 having diameters between 1 $\mu$m and 6 $\mu$m with a peak near 2 $\mu$m. Further, after yarn 16 of coated filaments 14 was formed as shown in FIG. 3, it was rolled in a silver foil about 50 $\mu$m thick and placed in a silver tube which had an outer diameter of 3.3 mm and an inner diameter of 2.8 mm. The ends of the tube were sealed in a vacuum and cold isostatically pressed to 140 MPa at about 20° C. to form elongate composite 28 shown in FIG. 4. Elongate composite 28 was then placed in a furnace which was heated from 20° C. to 860° C. at a rate of 50° C. per hour. The temperature was held at 860° C. for approximately 0.5 hours, and then raised to 890° C. at a rate of 60° C. per hour and held at 890° C. for one minute. The temperature was then lowered from 890° C. to 870° C. at a rate of 5° C. per hour and held at 870° C. for sixteen hours. Finally, the temperature was lowered to 20° C. at a rate of 50° C. per hour, and composite 28 was removed from the furnace.

The dimensions of the superconducting wire in this example included a cross sectional area of the silver tube of 0.092 cm$^2$, and a cross sectional area of the microfilamentary superconducting/normal metal composite of 0.014 cm$^2$. The critical current density, $J_c$, measured at various temperatures was found to be 1430, 710, 360, and 71 A/cm$^2$ at 10K, 18K, 28K, and 55K, respectively. At 4.2K, $J_c$ was 7000 A/cm$^2$ in a zero magnetic field, but dropped to 800 A/cm$^2$ at 0.5 T and then to 200 A/cm$^2$ at 16 T. In order to measure the strain tolerance of the superconducting wire of the present invention, the sample wire was bent around a cylindrical mandrel and measured in place at 4.2K in zero magnetic field. Under these conditions, the sample exhibited critical current densities of 5000, 4900, and 4700 A/cm$^2$ at bending strains of 0, 0.8% and 1.1%, respectively. Subsequent samples of the superconducting wire of the present invention exhibited a critical current density of 5000 A/cm$^2$ while under 1.2% bending strain at 4.2K in a zero magnetic field.

As is evident from the foregoing description, the present invention provides a highly strain tolerant superconducting wire material and a process for making it. The superconducting wire is formed from a high temperature superconducting material, so that commercial applications using the superconducting wire of the present invention can operate at higher temperatures than those applications using previous low temperature superconductors. Further, as demonstrated above, the superconducting wire of the present invention can produce substantial supercurrents while under significant amounts of strain.

We claim:

1. A method of producing a strain tolerant multifilamentary wire capable of carrying superconducting currents comprising the steps of:

providing a plurality of amorphous filaments of a high Tc material capable of conducting superconducting currents when in the crystalline state, the length of the filaments being at least several orders of magnitude greater than the filament diameter;

coating the filaments with a thin layer of normal conductive metal on the exterior surfaces of the filaments;

orienting the coated filaments such that the length of the filaments is generally along an elongate axis of the microfilamentary wire, the step of orienting producing substantial filament-to-filament overlap;

compacting the oriented coated filaments to form an elongate composite in which the overlapped coated filaments are pressed into contact with each other; and heat treating the composite to crystallize the amorphous filaments while leaving a normal metal interface between the crystallized filaments, the step of heat treating serving to preserve the normal metal coating on the filaments to form said interface to produce the multifilamentary wire capable of carrying superconducting currents in which the crystallized superconducting filaments are supported in a normal metal matrix.

2. The method of claim 1 wherein the material used to form the amorphous filaments is the high temperature superconducting material (Bi,Pb)-Sr-Ca-Cu-O.

3. The method of claim 1 wherein the step of processing comprises coating the amorphous filaments with a thin layer of a normal conductive metal by thermal evaporation or chemical vapor deposition to a thickness of about 0.5 $\mu$m.

4. The method of claim I further comprising distributing a silver based powder with the oriented coated filaments prior to compacting the filaments.

5. The method of claim 1 wherein the step of orienting the plurality of coated filaments comprises propelling the filaments against a barrier in order to form the filaments into a yarn so that the lengths of the plurality of filaments lie generally along an elongate axis of the filamentary wire.

6. The method of claim I wherein the compacting step further comprises:

placing the oriented coated filaments in a normal metal tube; and compacting the normal metal tube by cold isostatic pressing or swaging to form an elongate composite.

7. The method of claim 1 wherein the step of heat treating the composite comprises cycling the heat treating temperature in a range capable of crystallizing the amorphous filaments without melting the normal metal such that the normal metal matrix retains sufficient structural integrity to preserve the arrangement of the plurality of filaments in the multifilamentary wire.

8. The method of claim 1 wherein the normal conductive metal coating on the amorphous filaments is silver.

9. The method of claim 8 wherein the temperature during the heat treating step is sufficiently high to crystallize the amorphous filaments but is lower than the melting point of the silver coating.

10. The method of claim 1 wherein the normal metal matrix is sufficiently thin to allow for transfer of superconducting currents between the overlapped filaments.

* * * * *